United States Patent
Bae

(10) Patent No.: US 7,292,446 B2
(45) Date of Patent: Nov. 6, 2007

(54) PLASMA DISPLAY PANEL (PDP)

(75) Inventor: Sung-Won Bae, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 194 days.

(21) Appl. No.: 11/295,548

(22) Filed: Dec. 7, 2005

(65) Prior Publication Data

US 2006/0148294 A1 Jul. 6, 2006

(30) Foreign Application Priority Data

Dec. 30, 2004 (KR) ........................ 10-2004-0116913

(51) Int. Cl.
*H05K 7/20* (2006.01)
*G09G 3/28* (2006.01)

(52) U.S. Cl. ................... 361/719; 361/690; 361/704; 345/60; 345/905

(58) Field of Classification Search ................... None
See application file for complete search history.

(56) References Cited

U.S. PATENT DOCUMENTS

| | | | |
|---|---|---|---|
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Sinoda et al. | |
| 5,724,054 A | 3/1998 | Shinoda | |
| 5,786,794 A | 7/1998 | Kishi et al. | |
| 5,952,782 A | 9/1999 | Nanto | |
| RE37,444 E | 11/2001 | Kanazawa | |
| 6,630,916 B1 | 10/2003 | Shinoda | |
| 6,707,436 B2 | 3/2004 | Setoguchi et al. | |
| 7,164,586 B2 * | 1/2007 | Lin | 361/714 |
| 7,218,521 B2 * | 5/2007 | Kim | 361/704 |
| 2005/0047067 A1 * | 3/2005 | Bang et al. | 361/681 |
| 2005/0258749 A1 * | 11/2005 | Ahn | 313/582 |

FOREIGN PATENT DOCUMENTS

| | | |
|---|---|---|
| JP | 2845183 | 10/1998 |
| JP | 2917279 | 4/1999 |
| JP | 2001-043804 | 2/2001 |
| JP | 2001-325888 | 11/2001 |

\* cited by examiner

*Primary Examiner*—Boris Chervinsky
(74) *Attorney, Agent, or Firm*—Robert E. Bushnell, Esq.

(57) ABSTRACT

A Plasma Display Panel (PDP) includes: a panel adapted to display images using a plasma discharge; a chassis base attached to the panel and adapted to support the panel; a circuit board adapted to supply signals to electrodes of the panel; a signal transmission unit adapted to electrically connect the electrodes of the panel to the circuit board, and including at least one circuit device; and a chassis bed adapted to support the signal transmission unit. The chassis bed includes at least a first ventilation hole adapted to facilitate air flow therethrough to remove heat generated by the at least one circuit device. The heat generated by the circuit device can be dissipated effectively, and overheating of the circuit board is prevented, and the circuit board can operate stably.

12 Claims, 7 Drawing Sheets

PLASMA DISPLAY PANEL (PDP)

CLAIM OF PRIORITY

This application makes reference to, incorporates the same herein, and claims all benefits accruing under 35 U.S.C. §119 from an application for PLASMA DISPLAY PANEL earlier filed in the Korean Intellectual Property Office on 30 Dec. 2004 and there duly assigned Serial No. 10-2004-0116913.

BACKGROUND OF THE INVENTION

1. Field of the Invention

The present invention relates to a Plasma Display Panel (PDP), and more particularly, to a PDP including a chassis bed capable of accelerating air flow in a space sealed by the chassis bed.

2. Description of the Related Art

A panel of a Plasma Display Panel (PDP) is fabricated by sealing a front substrate and a rear substrate, and the panel is attached to a chassis base by adhesive tape. In addition, a heat dissipation sheet is disposed between the chassis base and the rear substrate to transmit the heat generated by the panel to the chassis base to be dissipated, or disperses the heat generated by a predetermined position of the panel to other regions of the panel so that the heat is not locally concentrated on a certain region. Various circuit boards are mounted on a rear portion of the chassis base.

In such a PDP having the above structure, electrodes of the panel are connected to the circuit board 50 such as a buffer board through a signal transmission unit such as a Tape Carrier Package (TCP) of a tape pattern.

A circuit device, such as an Integrated Circuit (IC), is mounted on the signal transmission unit, such as the TCP, and thus, tens of circuit lines extending from the panel are integrated by the circuit device to be a few circuit lines and connected to the circuit board, such as the buffer board. For example, the PDP including two ICs that are mounted on the TCP, an end of which is a 72-pin panel electrode connection terminal and the other end of which is a 8-pin buffer board connection terminal, is being distributed.

The circuit device, such as the IC, is mounted on a chassis bed, which is double-bent generally in a Z-shape on the chassis base, using a thermal grease. A cover plate is mounted on the upper portion of the circuit device, that is, the IC.

In the PDP having the above structure, the end portion of the chassis base is attached to the chassis bed to form the sealed space, and some of the heat generated by the circuit device mounted on the circuit transmission unit is conducted through the chassis bed that contacts the circuit device, and then, the heat is convected in the sealed space.

With the chassis bed of the PDP discussed above, the air in the sealed space can only flow through opening portions at both ends of the chassis bed in the transverse direction, and thus, there are a lot of spatial limitations in the flow the air. Accordingly, cooling of the heated air cannot be performed sufficiently, and thus, the cooling efficiency of the circuit device is reduced greatly.

SUMMARY OF THE INVENTION

The present invention provides a Plasma Display Panel (PDP) having a chassis bed capable of sufficiently allowing the flow of air heated by heat generated by a circuit device attached to a signal transmission unit of the PDP, and thus, cooling down the air and improving the cooling efficiency with respect to heat generated by the circuit device.

According to one aspect of the present invention, a Plasma Display Panel (PDP) is provided including: a panel adapted to display images using a plasma discharge; a chassis base attached to the panel and adapted to support the panel; a circuit board adapted to supply signals for electrodes of the panel; a signal transmission unit adapted to electrically connect the electrodes of the panel to the circuit board, and including at least one circuit device; and a chassis bed adapted to support the signal transmission unit. The chassis bed includes at least a first ventilation hole adapted to facilitate air flow therethrough to remove heat generated by the at least one circuit device.

At least a second ventilation hole is preferably arranged on a part of the chassis base defining a sealed space by attachment to the chassis bed and adapted to facilitate air flow through the at least one first and the at least one second ventilation holes.

The at least one ventilation hole is preferably arranged to facilitate air flowing through the at least one first ventilation hole to flow between the circuit board and the chassis base.

At least one third ventilation hole is preferably arranged on the circuit board and adapted to facilitate air flowing between the circuit board and the chassis base to flow from a lower portion of the circuit board to an upper portion of the circuit board through the at least one third ventilation hole penetrating the circuit board.

The at least one ventilation hole is preferably rectangular or slit shaped.

The chassis bed preferably includes: a first surface contacting the chassis base and parallel to the chassis base; a second surface bent from the first surface at a right angle and extending perpendicular to the chassis base; and a third surface bent from the second surface at a right angle and extending parallel to the chassis base with a gap therebetween. The at least one ventilation hole is preferably arranged on the second surface of the chassis base.

According to another aspect of the present invention, a display panel is provided including: a panel adapted to display images; a chassis base attached to the panel and adapted to support the panel; a circuit board adapted to supply signals for the panel; at least one circuit device adapted to electrically connect the panel to the circuit board; and a chassis bed adapted to support the at least one circuit device. The chassis bed preferably includes at least a first ventilation hole adapted to facilitate air flow therethrough to remove heat generated by the at least one circuit device.

At least a second ventilation hole is preferably arranged on a part of the chassis base defining a sealed space by attachment to the chassis bed and adapted to facilitate air flow through the at least one first and the at least one second ventilation holes.

The at least one ventilation hole is preferably arranged to facilitate air flowing through the at least one first ventilation hole to flow between the circuit board and the chassis base.

At least one third ventilation hole is preferably arranged on the circuit board and adapted to facilitate air flowing between the circuit board and the chassis base to flow from a lower portion of the circuit board to an upper portion of the circuit board through the at least one third ventilation hole penetrating the circuit board.

The at least one ventilation hole is preferably rectangular or slit shaped.

The chassis bed preferably includes: a first surface contacting the chassis base and parallel to the chassis base; a second surface bent from the first surface at a right angle and extending perpendicular to the chassis base; and a third surface bent from the second surface at a right angle and extending parallel to the chassis base with a gap therebetween. The at least one ventilation hole is preferably arranged on the second surface of the chassis base.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
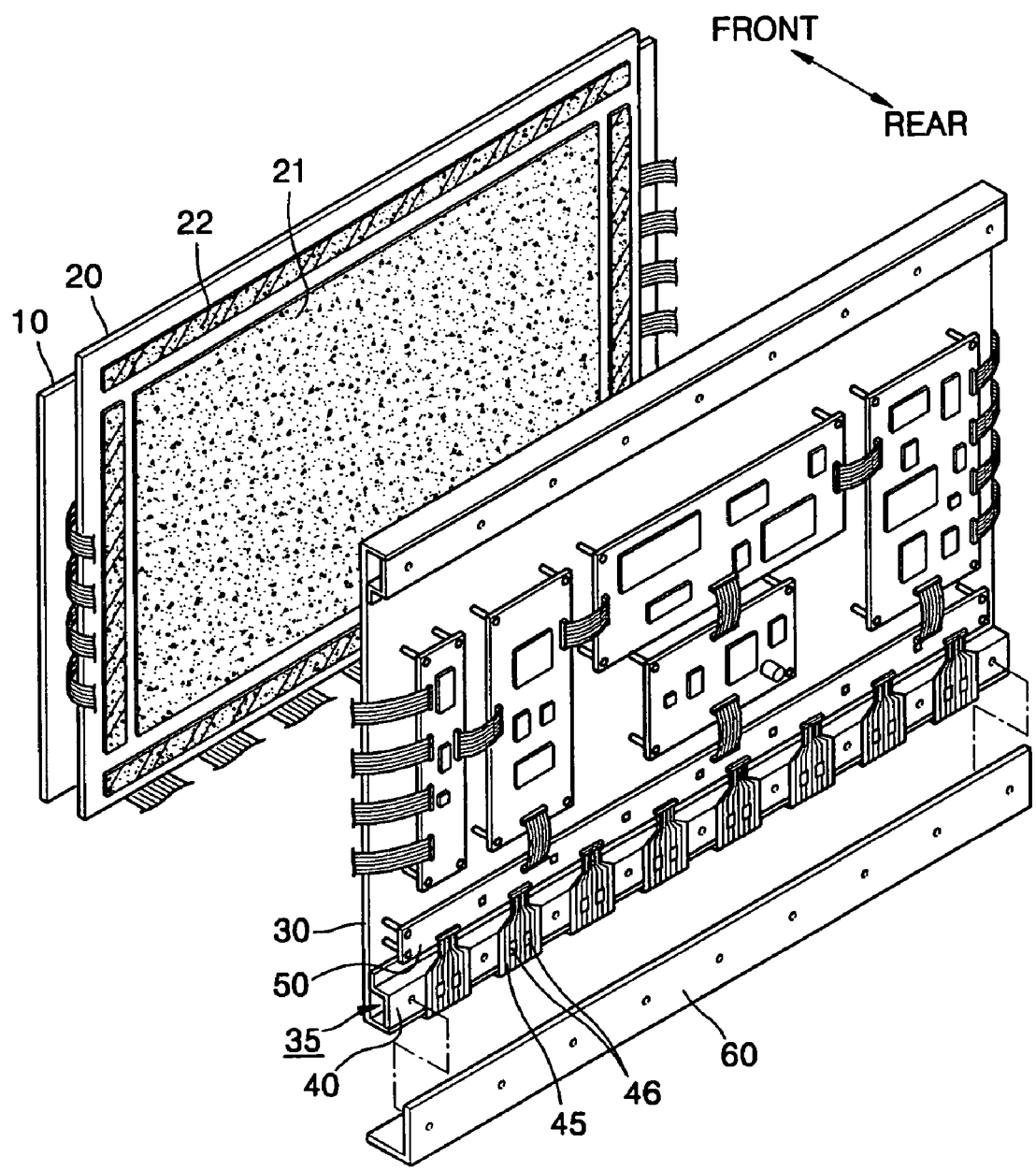
FIG. 1 is an exploded perspective view of a Plasma Display Panel (PDP)

FIG. 1 is an exploded perspective view of a Plasma Display Panel (PDP). A panel of the PDP is fabricated by sealing a front substrate 10 and a rear substrate 20, and the panel is attached to a chassis base 30 by adhesive tape 22. In addition, a heat dissipation sheet 21 is disposed between the chassis base 30 and the rear substrate 20 to transmit the heat generated by the panel to the chassis base to be dissipated, or disperses the heat generated by a predetermined position of the panel to other regions of the panel so that the heat is not locally concentrated on a certain region. Various circuit boards 50 are mounted on a rear portion of the chassis base 30.

In such a PDP having the above structure, electrodes of the panel are connected to the circuit board 50 such as a buffer board through a signal transmission unit 45 such as a Tape Carrier Package (TCP) of a tape pattern.

A circuit device 46, such as an Integrated Circuit (IC), is mounted on the signal transmission unit 45, such as the TCP, and thus, tens of circuit lines extending from the panel are integrated by the circuit device 46 to be a few circuit lines and connected to the circuit board 50, such as the buffer board. For example, the PDP including two ICs that are mounted on the TCP, an end of which is a 72-pin panel electrode connection terminal and the other end of which is a 8-pin buffer board connection terminal, is being distributed.

The circuit device 46, such as the IC, is mounted on a chassis bed 40, which is double-bent generally in a Z-shape on the chassis base 30, using a thermal grease. A cover plate 60 is mounted on the upper portion of the circuit device 46, that is, the IC.

In the PDP having the above structure, the end portion of the chassis base 30 is attached to the chassis bed 40 to form the sealed space 35, and some of the heat generated by the circuit device 46 mounted on the circuit transmission unit 45 is conducted through the chassis bed 40 that contacts the circuit device 46, and then, the heat is convected in the sealed space 35.

Figure 2:
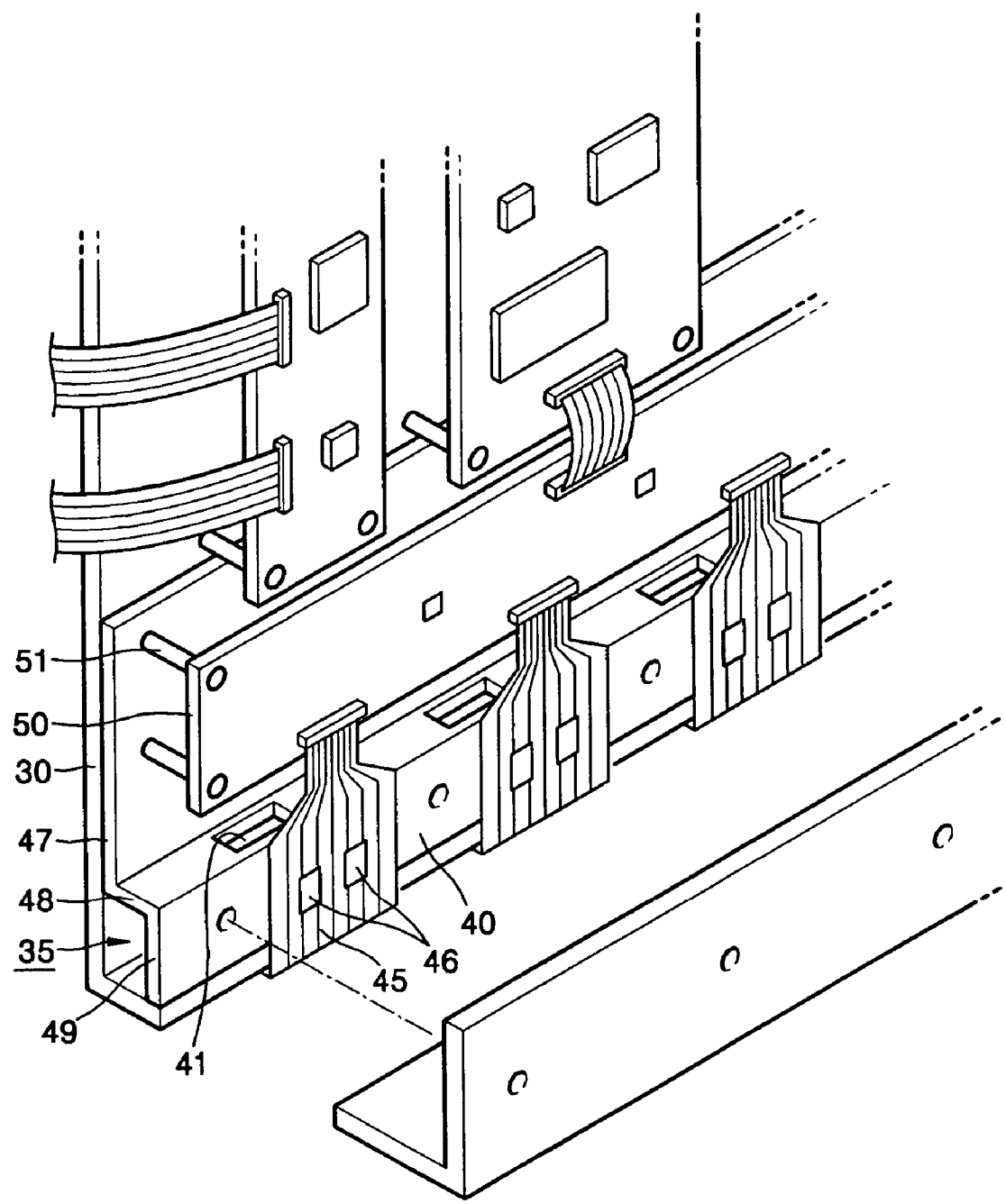
FIG. 2 is a perspective view of an end portion of a chassis base including a chassis bed according to an embodiment of the present invention.

FIG. 2 is a perspective view of a chassis bed of a PDP according to an embodiment of the present invention. The chassis bed 40 is attached to at least one end portion of a chassis base 30. The chassis bed 40 supports a signal transmission unit 45 that electrically connects a plurality of electrodes located on the panels (10 and 20, refer to FIG. 1) to a circuit board 50 located on a rear surface of the chassis base 30. The circuit board 50 that is electrically connected to the electrodes of the panel via the signal transmission unit 45 is generally referred to as a buffer board, and a Tape Carrier Package (TCP) is generally used as the signal transmission unit 45.

A circuit device 46, such as an Integrated Circuit (IC), is mounted on the signal transmission unit 45, that is, the TCP. Then, tens of circuit lines extending from the electrodes of the panels are integrated by the circuit device 46, that is, the IC, to be simplified into a few circuit lines, and connected to the circuit board 50 such as the buffer board.

The circuit device 46, such as the TCP IC, generates heat due to the electrical resistances therein, and the heat is conducted onto the chassis bed 40 and convected into the air on a large surface of the chassis bed 40 to be cooled down. In the present invention, at least one ventilation hole 41 is formed on the chassis bed 40 to allow sufficient air flow when the heat conducted from the circuit device 46 is convected in the air, thus sufficiently cooling the air. That is, refer to FIG. 3A, some of the heat generated by the circuit device 46 is convected in the air in a sealed space 35 formed by attaching the chassis bed 40 to the chassis base 30, and the air heated by the thermal conduction can be exhausted out of the sealed space 35 through the at least one ventilation hole 41 formed on the chassis bed 40.

In general, the chassis bed 40 coupled to the end portion of the chassis base 30 is formed as dual-bent shape. The chassis bed 40 can then be divided into three sections. That is, the chassis bed 40 includes a first surface 47 contacting the chassis base 30 with its surface, a second surface 48 bent from the first surface 47 at a right angle to extend perpendicularly to the chassis base 30, and a third surface 49 bent from the second surface 48 at a right angle to extend parallel to the chassis base 30 with a predetermined interval therebetween and to support the signal transmission unit, such as the TCP, on the upper portion thereof. The heat generated by the circuit device is initially conducted to the third surface 49, and then, to the second surface 48, the first surface 47, and the chassis base 30.

According to the present invention, the ventilation hole 41 can be formed on the second surface 48 of the chassis bed 40. However, the ventilation hole 41 can be also formed on the first surface 47. In this case, it is desirable that the ventilation hole 41 is installed on a portion of the third surface 49 where the signal transmission unit 45 is not attached.

Figure 3A:
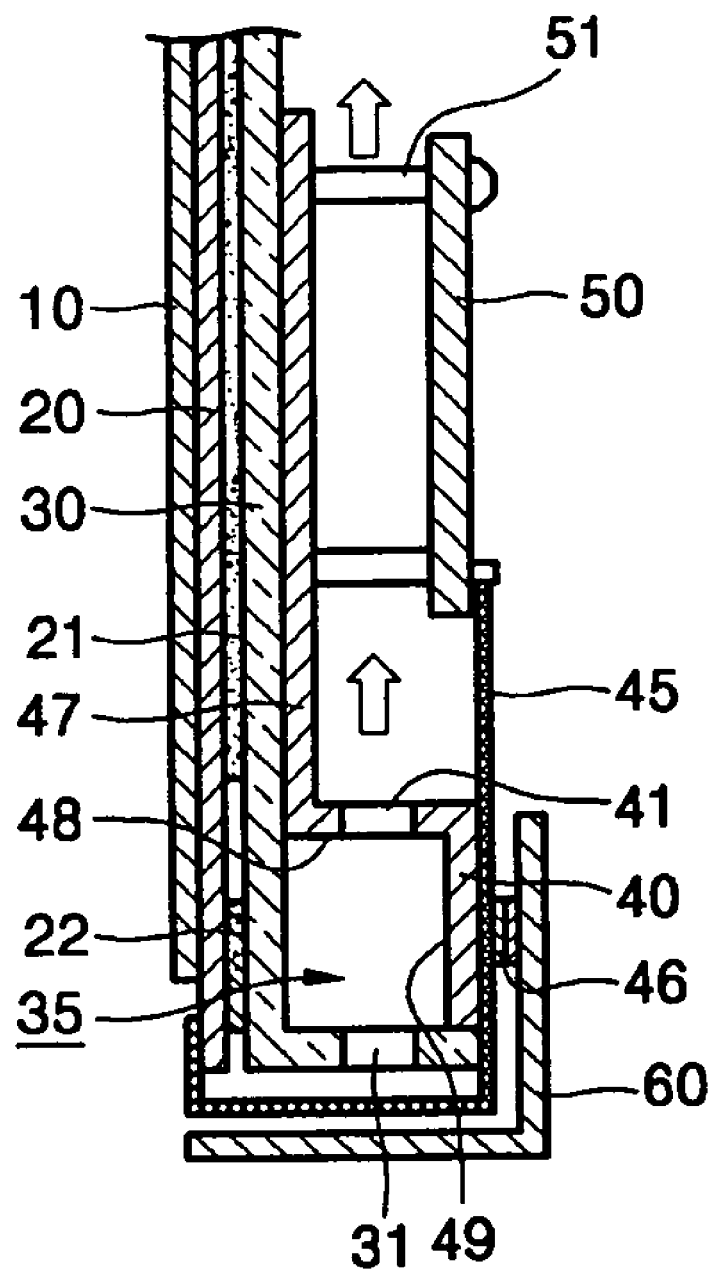
FIGS. 3A and 3B are cross-sectional views of the end portion of the chassis base of FIG. 2.

In addition, referring to FIG. 3A, if the end portion of the chassis base 30 is bent to be attached to the third surface 49 of the chassis bed 40. A second ventilation hole 31 can be formed on the surface of the chassis base 30 facing the ventilation hole 41 of the chassis bed 40. Through the above structure, a sufficient air flow in the sealed space can be effected.

The ventilation hole 41 is formed as a rectangle in the drawings. However, the ventilation hole 41 can be formed as a square shape, a circular shape, any other polygonal shape, or an irregular shape if it can allow a sufficient air flow.

Otherwise, the ventilation hole 41 can be formed as a slit in consideration of the spatial structure of the chassis bed 40.

The air exhausted out of the sealed space has lower density than the air in other regions, and thus, rises upward. According to the general installation of the PDP, since the chassis base 30 is vertically disposed, the heated air rising upward is inclined to move in a direction denoted by an arrow in FIG. 3A, and the air can sufficiently flow through the space between the circuit board 50 such as the buffer board and the chassis base 30. That is, when the air in the sealed space 35 heated by the circuit device 46, such as the TCP IC, flows sufficiently as described above, the cooling operation of the circuit device 46 can be accelerated, and accordingly, the circuit device 46 can operate stably.

Figure 3B:
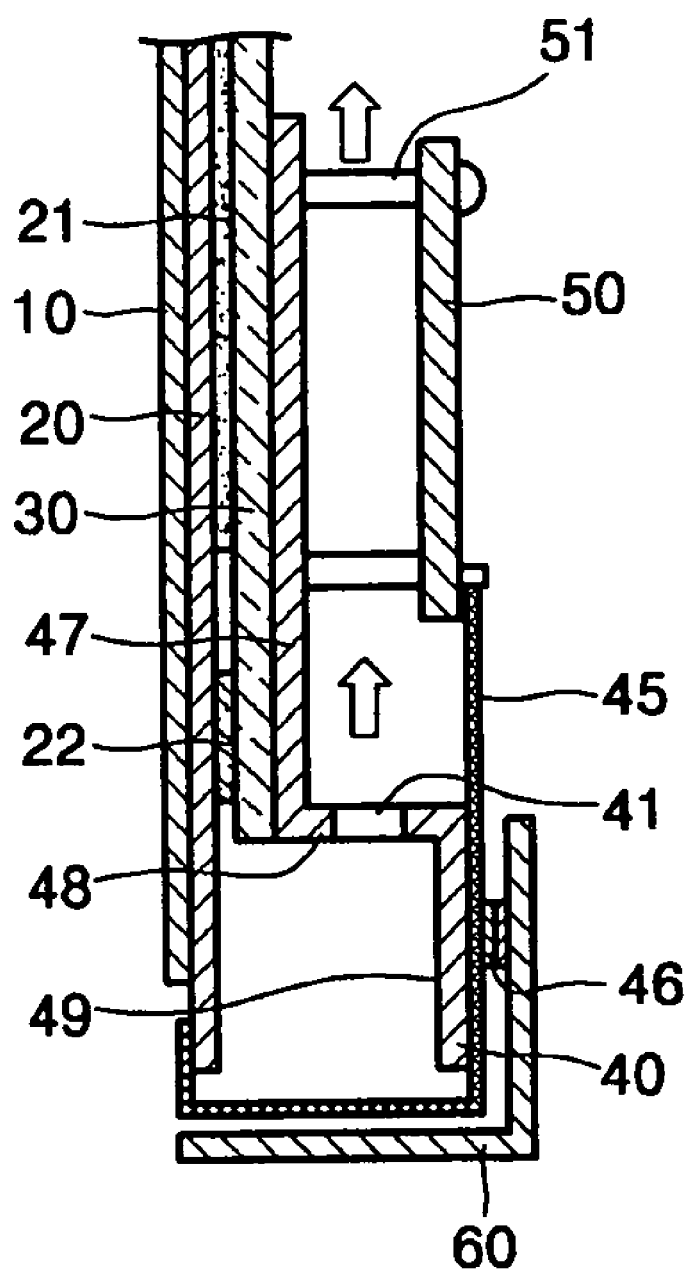

FIG. 3B shows another example of the PDP according to the present invention. In FIG. 3B, the end portion of the chassis base 30 is not bent to be attached to the third surface 49 of the chassis bed 40 and form the sealed space (35 of FIG. 3A). However, in the structure not providing the sealed space, at least one ventilation hole 41 can be formed on the chassis base 40, and thus, the air heated by the circuit device 46 can sufficiently flow through the ventilation hole 41.

The structure of the chassis bed 40 and the arrangement of the ventilation hole 41 on the chassis bed 40 are provided as examples for describing the PDP of embodiments of the present invention, and if the air in the sealed space or open space between the chassis bed and the chassis base can flow sufficiently toward the upper surface of the chassis base, the chassis bed and the arrangement of the ventilation hole can be variously modified.

Figure 4:
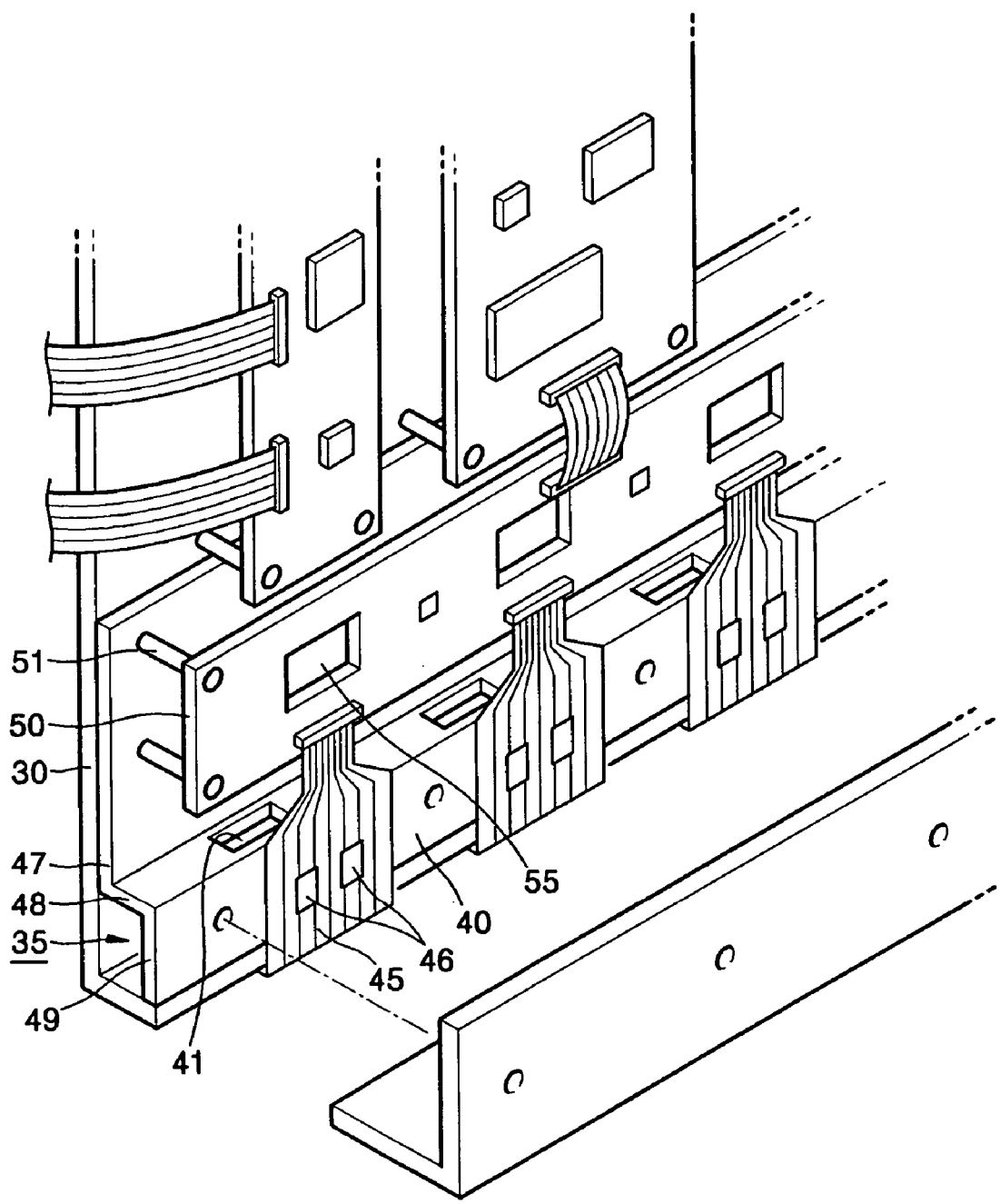
FIG. 4 is a perspective view of an end portion of a chassis base including a chassis bed according to another embodiment of the present invention.
Figure 5A:
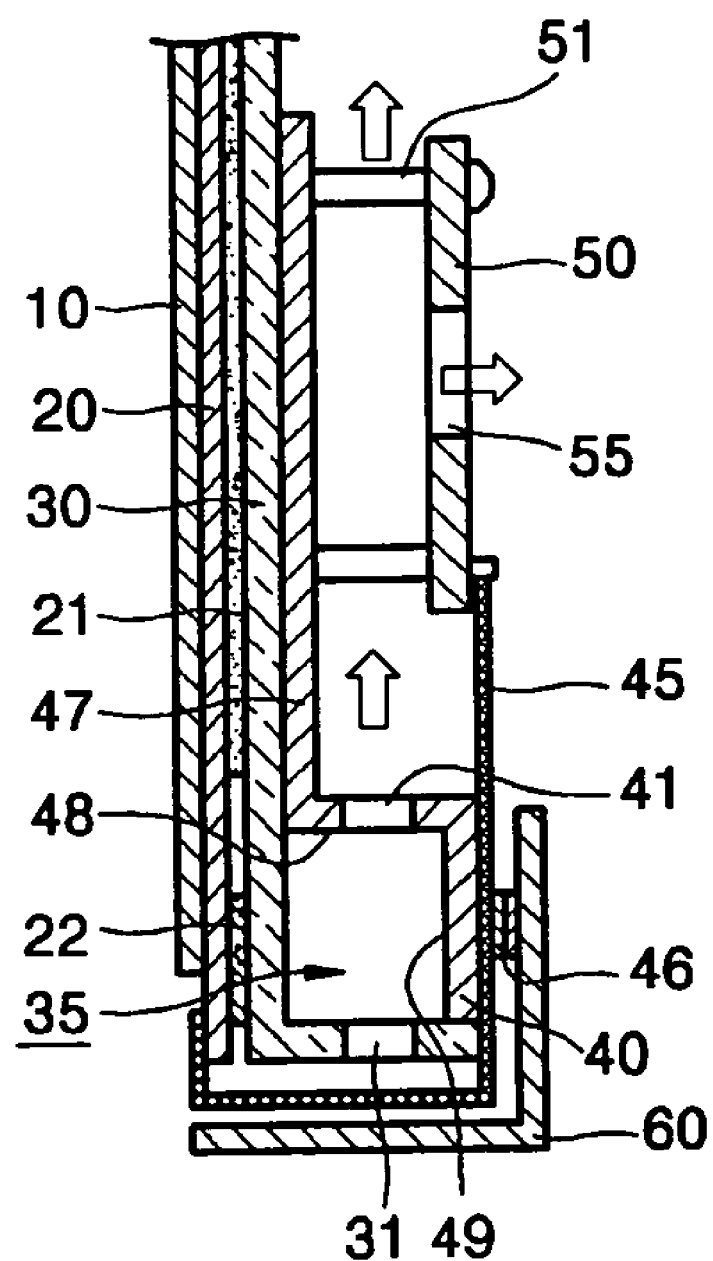
FIGS. 5A and 5B are cross-sectional views of the chassis base of FIG. 4.
Figure 5B:
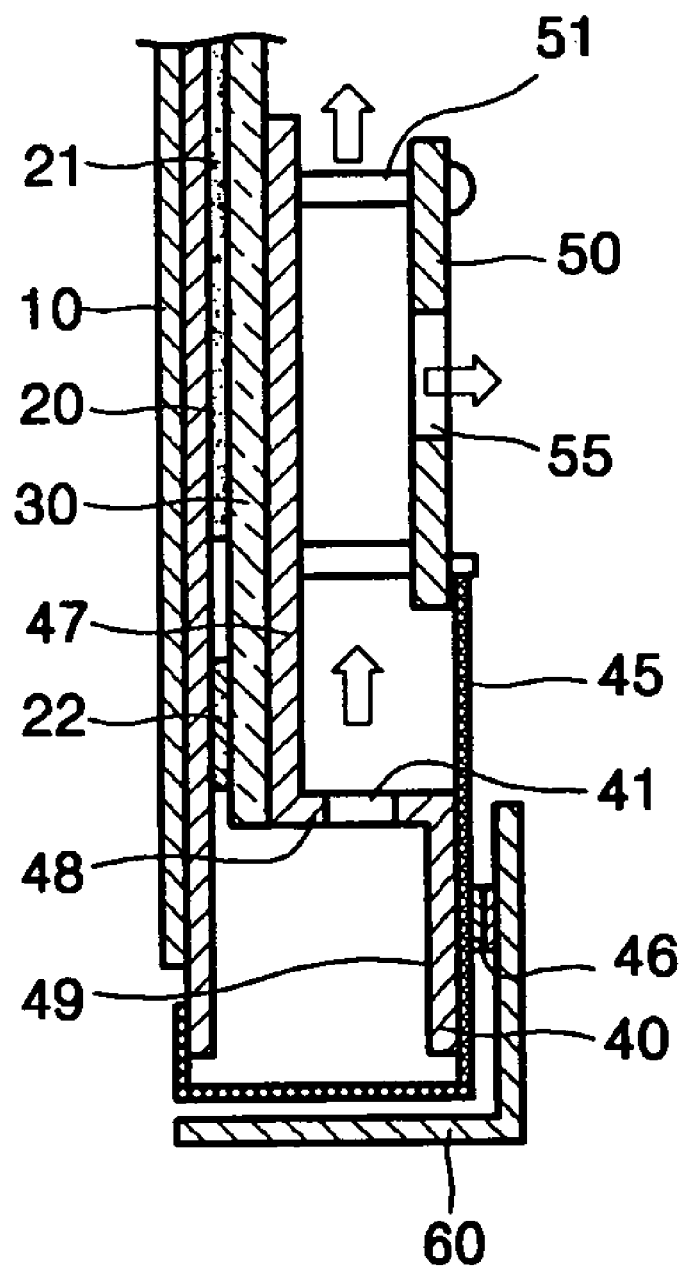

Referring to FIGS. 4, 5A, and 5B, the PDP of the present embodiment is the same as that of FIG. 3 except for a third ventilation hole 55 is formed on the circuit board 50 such as the buffer board. That is, the air heated by the circuit device 46 flows toward the upper portion of the chassis base 30 through the space between the circuit board 50 and the chassis base 30, and can flow while penetrating the circuit board 50 through the third ventilation hole 55 formed on the circuit board 50, and thus, the heat generated by the circuit board 46 can be effectively dissipated.

In FIG. 5B, the end portion of the chassis base 30 is not bent, and the other elements are the same as those of FIG. 5A. The difference between the panels of FIG. 5A and FIG. 5B can refer to the descriptions of FIGS. 3A and 3B.

In the PDP including the chassis bed 40 having the ventilation holes 31, 41, and 55 and the circuit board 50, the air heated by the circuit device 46, such as the TCP IC, can sufficiently flow through the ventilation holes 31, 41, and 55, and thus, the heat dissipation of the circuit device 46 can be accelerated. Since the overheat problem of the TCP IC becomes serious in a single scan PDP, the present invention can be applied to the single scan PDP. However, the present invention also can be applied to a dual scan PDP if the panel has the overheat problem of the TCP IC.

With the PDP including the chassis bed, the heat generated by the circuit device can be efficiently dissipated. Therefore, the overheat problem of the circuit device, such as the TCP IC, can be solved, and the circuit device can operate stably.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A Plasma Display Panel (PDP), comprising:
   a panel adapted to display images using a plasma discharge;
   a chassis base attached to the panel and adapted to support the panel;
   a circuit board adapted to supply signals for electrodes of the panel;
   a signal transmission unit adapted to electrically connect the electrodes of the panel to the circuit board, and including at least one circuit device; and
   a chassis bed adapted to support the signal transmission unit;
   wherein the chassis bed includes at least a first ventilation hole adapted to facilitate air flow therethrough to remove heat generated by the at least one circuit device.

2. The PDP of claim 1, wherein at least a second ventilation hole is arranged on a part of the chassis base defining a sealed space by attachment to the chassis bed and adapted to facilitate air flow through the at least one first and the at least one second ventilation holes.

3. The PDP of claim 1, wherein the at least one ventilation hole is arranged to facilitate air flowing through the at least one first ventilation hole to flow between the circuit board and the chassis base.

4. The PDP of claim 3, wherein at least one third ventilation hole is arranged on the circuit board and adapted to facilitate air flowing between the circuit board and the chassis base to flow from a lower portion of the circuit board to an upper portion of the circuit board through the at least one third ventilation hole penetrating the circuit board.

5. The PDP of claim 1, wherein the at least one ventilation hole is rectangular or slit shaped.

6. The PDP of claim 1, wherein the chassis bed comprises:
   a first surface contacting the chassis base and parallel to the chassis base;
   a second surface bent from the first surface at a right angle and extending perpendicular to the chassis base; and
   a third surface bent from the second surface at a right angle and extending parallel to the chassis base with a gap therebetween;
   wherein the at least one ventilation hole is arranged on the second surface of the chassis base.

7. A display panel, comprising:
   a panel adapted to display images;
   a chassis base attached to the panel and adapted to support the panel;
   a circuit board adapted to supply signals for the panel;
   at least one circuit device adapted to electrically connect the panel to the circuit board; and
   a chassis bed adapted to support the at least one circuit device;
   wherein the chassis bed includes at least a first ventilation hole adapted to facilitate air flow therethrough to remove heat generated by the at least one circuit device.

8. The display panel of claim 7, wherein at least a second ventilation hole is arranged on a part of the chassis base defining a sealed space by attachment to the chassis bed and adapted to facilitate air flow through the at least one first and the at least one second ventilation holes.

9. The display panel of claim 7, wherein the at least one ventilation hole is arranged to facilitate air flowing through the at least one first ventilation hole to flow between the circuit board and the chassis base.

10. The display panel of claim 9, wherein at least one third ventilation hole is arranged on the circuit board and adapted to facilitate air flowing between the circuit board and the chassis base to flow from a lower portion of the circuit board to an upper portion of the circuit board through the at least one third ventilation hole penetrating the circuit board.

11. The display panel of claim 7, wherein the at least one ventilation hole is rectangular or slit shaped.

12. The display panel of claim 7, wherein the chassis bed comprises:
   a first surface contacting the chassis base and parallel to the chassis base;
   a second surface bent from the first surface at a right angle and extending perpendicular to the chassis base; and
   a third surface bent from the second surface at a right angle and extending parallel to the chassis base with a gap therebetween;
   wherein the at least one ventilation hole is arranged on the second surface of the chassis base.

* * * * *